(12) United States Patent
Juengling

(10) Patent No.: US 6,417,113 B1
(45) Date of Patent: *Jul. 9, 2002

(54) MATERIAL REMOVAL METHOD USING GERMANIUM

(75) Inventor: Werner Juengling, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/650,778

(22) Filed: Aug. 29, 2000

Related U.S. Application Data

(63) Continuation of application No. 09/052,112, filed on Mar. 31, 1998, now Pat. No. 6,114,255, which is a continuation of application No. 08/533,184, filed on Sep. 25, 1995, now Pat. No. 5,750,442.

(51) Int. Cl.$^7$ ................................................ H01L 21/31
(52) U.S. Cl. ...................... 438/763; 438/761; 438/947; 438/950; 438/952
(58) Field of Search .................... 438/761, 763, 438/947, 952, 950, 439

(56) References Cited

U.S. PATENT DOCUMENTS

| | | | |
|---|---|---|---|
| 4,942,451 A | 7/1990 | Tamaki et al. | 257/742 |
| 5,378,659 A | 1/1995 | Roman et al. | 438/761 |
| 5,580,701 A | 12/1996 | Lur et al. | 438/952 |
| 5,656,128 A | 8/1997 | Hashimoto et al. | 438/952 |
| 5,750,442 A | * 5/1998 | Juengling | 438/761 |
| 6,114,255 A | * 9/2000 | Juengling | 438/763 |

FOREIGN PATENT DOCUMENTS

| | | |
|---|---|---|
| JP | 1-243521 | 9/1989 |

\* cited by examiner

*Primary Examiner*—Trung Dang
(74) *Attorney, Agent, or Firm*—Workman, Nydegger & Seeley

(57) ABSTRACT

A germanium and silicon alloy is employed as an antireflective coating material for use in active area lithography and gate area lithography steps in the formation of a semiconductor integrated circuit. A layer composed of an alloy of germanium-silicon is deposited over an active area nitride layer or over a gate area nitride layer, and a photoresist layer is then formed on the germanium-silicon alloy layer. The photoresist layer is than exposed and developed. During exposure, the germanium-silicon alloy layer substantially reduces reflection from the underlying nitride layer, thereby relieving the dependency of exposure energy and resulting line width on the underlying nitride layer thickness.

29 Claims, 2 Drawing Sheets

MATERIAL REMOVAL METHOD USING GERMANIUM

This is a continuation of U.S. patent application Ser. No. 09/052,112, filed on Mar. 31, 1998, now U.S. Pat. No. 6,114,255, which is a continuation of U.S. patent application Ser. No. 08/533,184, filed on Sep. 25, 1995, now U.S. Pat. No. 5,750,442, both of which are incorporated herein by reference.

BACKGROUND OF THE INVENTION

1. The Field of the Invention

The present invention relates to the manufacture of semiconductor devices. More particularly, the present invention is directed to novel processes for use of germanium as an antireflective coating in active area and gate lithography steps.

2. The Relevant Technology

The need for increased miniaturization in integrated circuit semiconductor devices is well known. As feature sizes decrease, the need for more precise control of photolithography, often a limiting process, becomes acute. Better control of the line width produced by photolithography enables more aggressive circuit design for faster, higher performance circuits.

The line width produced by a photolithography process varies with many factors, including the amount of energy absorbed by the photoresist during exposure. For example, with positive photoresists, increased exposure energy decreases line width while decreased exposure energy increases line width. Precise control of line width thus requires precise control of exposure energies.

Control of exposure energy can be complicated by the varying reflectivity of the layers immediately below the photoresist. Photoresist over high reflectivity areas will be overexposed compared to photoresist over low reflectivity areas.

Nitride layers in particular vary significantly in reflectivity with varying thickness. The reflectivity of a nitride layer varies periodically with its thickness. At a minimum or maximum in the reflectivity function, reflectivity changes only slowly for every unit change of nitride thickness. Under current processing techniques, to avoid significant variation in exposure energy over the surface of a wafer, deposited nitride layer thickness is carefully controlled over the entire wafer surface to be as near as possible to a minimum or maximum of the periodic reflectivity function. But precise thickness control of nitride growth is difficult, particularly at the relatively thick 2000 Angstroms thickness that is employed in a typical active area stack, in which the required tolerance is approximately only ±50 Angstroms. Antireflective coatings (ARCs) can substantially reduce the reflected energy during photolithography, reducing the need for critical control of the thickness of underlying layers.

ARCs can also assist in avoiding standing waves in the photoresist during exposure. The presence of standing waves in the photoresist are problematic in that the reflected waves cause interference with the incoming wave and cause the intensity of the light to vary periodically in a direction normal to the photoresist. Standing waves cause variations in the development rate along edges of the photoresist, and degrade the image resolution. Further, standing waves can cause both necking and notching in the patterned area. ARCs helpful to reduce standing waves are typically a 130 nm thick polymer which has a high absorbance at the exposure wavelength so as to considerably reduce interference due to reflectance from the substrate.

Despite the forgoing benefits of using ARCs, conventional ARCs used in semiconductor processing are incompatible with the processes used in formation of the active area. The presence of an ARC complicates the task of etching. A layer of metal ARC, such as TiW or TiN, can contaminate the silicon substrate itself. Titanium nitride as an ARC produces mobile ionic contaminates in the active and isolation regions. Polysilicon as an ARC is not easily removed before field oxidation and results in unwanted oxide growth at the polysilicon locations during field oxidation, which oxide growth is not easily removed without removing or undesirably reducing the desired field oxide thickness. Accordingly, there is a need in the art to relieve the critical thickness control requirements of nitride layers in active area stacks.

SUMMARY AND OBJECTS OF THE INVENTION

An object of the present invention is to relieve the critical thickness control requirements of active area stack nitride layers.

Another object of the present invention is to provide an antireflective coating suitable for use in active area lithography.

Another object of the present invention is to provide an antireflective coating suitable for use in gate area lithography.

Another object of the present invention is improve line width control in active area photolithography.

Another object of the present invention is to improve line width control in gate area photolithography.

Another object of the present invention is to enable tighter, more aggressive circuit design for improved circuit speed and performance.

Another object of the present invention is to more easily remove photoresist.

In accordance with the present invention, a thin layer of germanium is deposited by sputtering, CVD, or other appropriate process over the top layer of a conventional gate or active area stack, such as a thick silicon nitride layer. The germanium layer is then covered with photoresist. Subsequent masking steps are then performed in a conventional manner.

The optical properties of germanium make it favorable as an ARC in that it has a high reflectivity of about 2.579 and a permitivity of about 4.07. Germanium has good compatibility with conventional active area and gate processing. Germanium provides good antireflective properties, is easily removed during subsequent processing, and does not contaminate the wafer. The antireflective properties of the germanium layer allow for much greater variation in the thickness of the underlying nitride layer, providing better line width control and with it the potential for decreased feature tolerance so as to allow for more aggressive circuit design. Fabrication efficiency is also increased due to the inherently better yield potential of improved line width control, and due to less rework of wafers having out-of-specification nitride layer thickness. The germanium layer also facilitates the complete removal of the photoresists, since the germanium layer upon which the photoresist is deposited is itself completely removed.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention that are obtained may be more fully explained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention introduces the use of germanium as an antireflective coating for use in semiconductor processing specifically in active area lithography and in gate lithography. Germanium provides ideal compatibility with the processes used in formation of the active area. Germanium will not contaminate the wafer. Furthermore, germanium is easily removed from an underlying nitride layer. Germanium itself will be removed by a piranha clean. Germanium, once oxidized, is water soluble and can thus be removed by any one of a number of other standard cleaning processes. The high temperature oxidation during field oxidation or other oxidation steps will also oxidize and evaporate any remaining traces of germanium.

Figure 1:
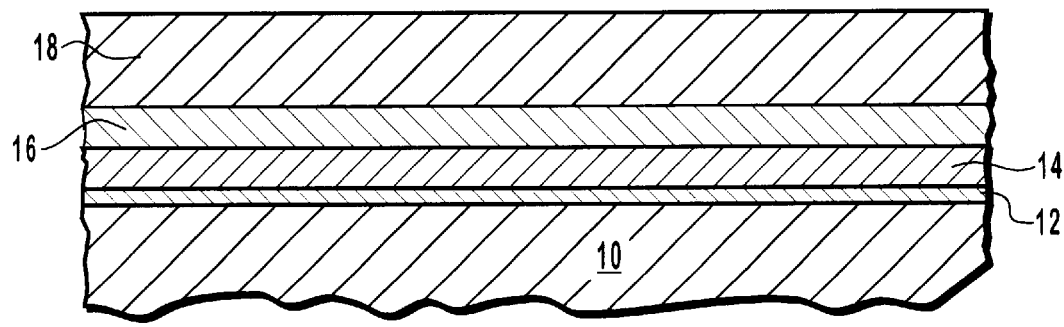
FIG. 1 shows a partial cross section of a semiconductor wafer having thereon an antireflective coating of the present invention which has been deposited upon an active area nitride layer and covered with a photoresist layer in preparation for active area lithography.

FIG. 1 shows a silicon substrate 10 having grown or deposited thereon a pad oxide layer 12, upon which in turn is deposited a nitride layer 14, upon which is deposited a germanium layer 16, upon which is formed a photoresist layer 18. Germanium layer 16 is preferably deposited by sputtering, by CVD, or by any other appropriate process. The thickness of the layer of germanium will be between about 200 Angstroms and 800 Angstroms. The thickness of the layer of nitride will be between about 1200 Angstroms and 2400 Angstroms.

In subsequent processing, photoresist layer 18 will be exposed and developed leaving a patterned photoresist layer. During the exposure, germanium layer 16 substantially reduces reflection from nitride layer 14, such that uniformity and control of exposure energy are increased, thus increasing uniformity and control of the resulting line width.

An anisotropic etch is then used to remove the areas of layers 12, 14, and 16 not shielded by the patterned photoresist.

Figure 3:
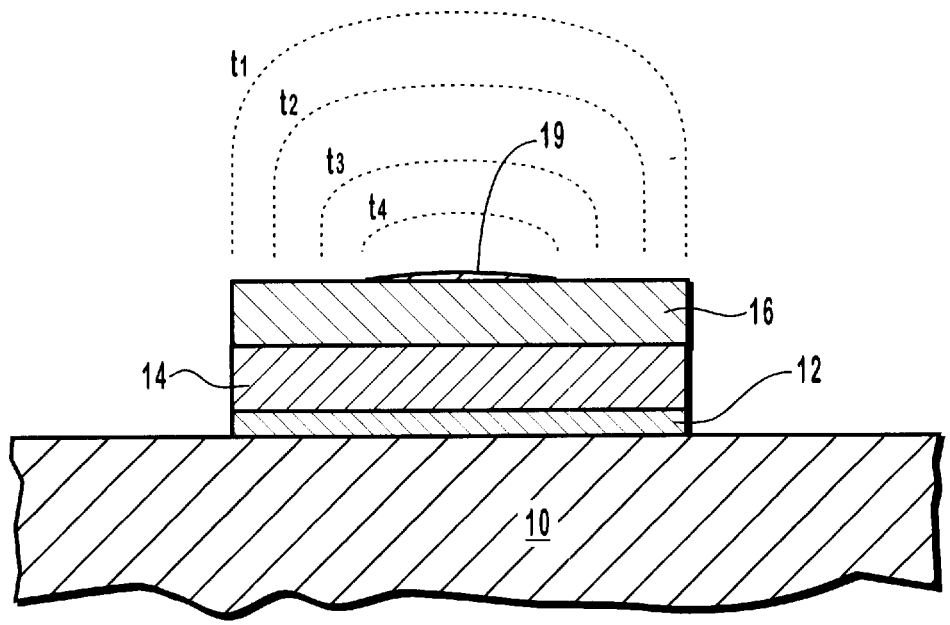
FIG. 3 shows the cross-section of FIG. 1 after some additional processing steps.

Next, the photoresist is stripped. The photoresist strip is performed by ashing followed by a piranha clean. Ashing removes the patterned photoresist from the outside surfaces of the resist inward, resulting in the photoresist having the profiles shown in FIG. 3 at successive times t1, t2, t3, t4. After ashing is complete, a photoresist residue 19 remains.

In conventional processing, residue 19 is removed by the piranha clean, but is somewhat difficult to remove completely. With the germanium layer of the present invention, the piranha clean removes germanium layer 16 from the stack. Thus all residue of the photoresist which remains after the ashing process is easily removed from the stack.

Figure 4:
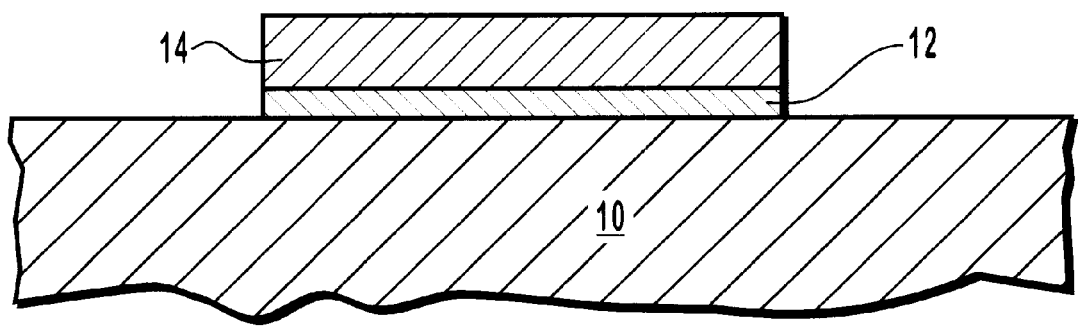
FIG. 4 shows the cross-section of FIG. 3 after further additional processing steps.

FIG. 4 shows the cross section of FIG. 1 after the above processing steps. An active area stack has been defined by the photolithography process. The stack includes pad oxide layer 12, and nitride layer 14. Germanium layer 16, together with residue 19, has been removed by the piranha clean.

Figure 5:
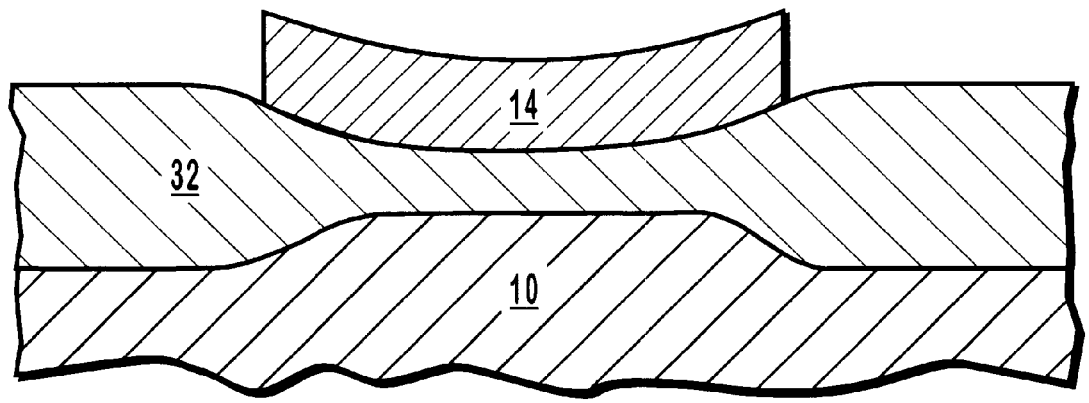
FIG. 5 shows the cross-section of FIG. 4 after still further additional processing steps.

Next the field oxide is grown on the exposed areas of the silicon substrate as seen in FIG. 5. FIG. 5 shows the cross section of FIG. 4 after the field oxidation. Field oxide 32 has been grown on and into substrate 10. During the field oxidation, traces of germanium, if they remain, will be simply oxidized and evaporated off of nitride layer 14. All traces of germanium layer 16, including germanium oxides, assuming any were left after photoresist strip, have been removed.

Figure 2:
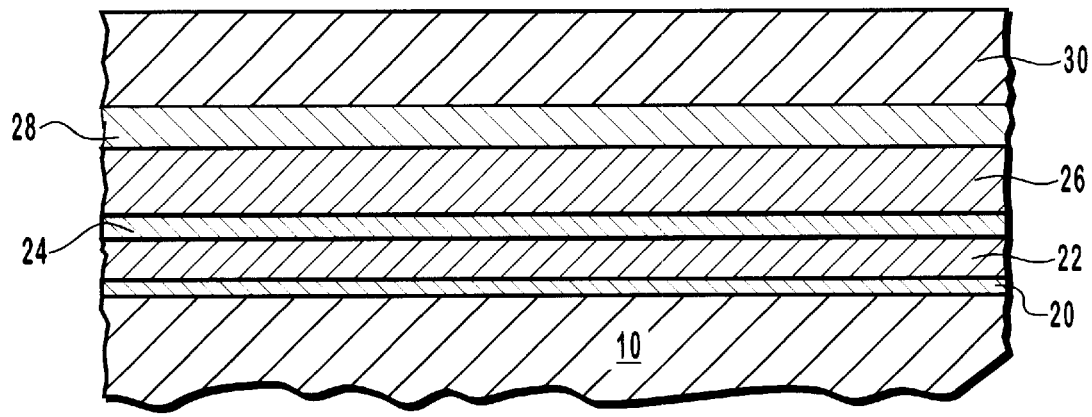
FIG. 2 shows a partial cross-section of a semiconductor wafer having thereon an antireflective coating of the present invention which has been deposited upon an gate area nitride layer and covered with a photoresist layer in preparation for gate area lithography.

The present invention, while particularly suited for active area lithography, is not limited thereto. FIG. 2 shows a germanium layer 28 which has been deposited over a gate nitride layer 26, which has previously been deposited over a tungsten silicide gate layer 24, which has previously been deposited over a polysilicon gate layer 22, which has been previously deposited over a gate oxide layer 20, which was deposited on substrate 10. A photoresist layer 30 has been formed upon germanium layer 28.

In subsequent processing, photoresist layer 30 will be exposed and developed. During exposure of photoresist layer 30, germanium layer 28 will substantially reduce reflection from underlying nitride layer 26, leading to good exposure control independent of the thickness of nitride layer 26.

The present invention is likewise applicable to any other semiconductor processing steps in which a wafer having a nitride top layer is to be patterned by photolithography.

In the practice of the present invention, a germanium-silicon ($Si_xGe_y$) layer may be substituted for the germanium layer, where x is about 0 to 0.2 and y is about 1.0 to 0.8. The germanium content of the germanium-silicon layer must only remain high enough to promote the easy removability of the layer.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for forming a structure comprising:

forming a dielectric layer over an electrically conductive layer;

forming a layer comprising germanium upon said dielectric layer; and selectively removing:

said dielectric layer beneath said layer comprising germanium; and said electrically conductive layer.

2. The method as defined in claim 1, further comprising, prior to said selectively removing, forming a pattern over the layer comprising germanium, wherein said selectively removing removes through said pattern each of:

said layer comprising germanium;

said dielectric layer; and said electrically conductive layer.

3. The method as defined in claim 1, wherein:

said layer comprising germanium is an antireflective layer; and said selectively removing further comprises photolithography and etching.

4. The method as defined in claim 1, wherein the layer comprising germanium is an alloy of germanium and silicon.

5. A method for forming a structure comprising:

forming a dielectric layer upon an a refractory metal silicide layer which is upon an electrically conductive layer;

forming a layer comprising germanium upon said dielectric layer; and selectively removing:
said dielectric layer beneath said layer comprising germanium;
said refractory metal silicide layer; and
said electrically conductive layer.

6. The method as defined in claim 5, further comprising, prior to said selectively removing, forming a pattern over the layer comprising germanium, wherein said selectively removing removes through said pattern each of:

said layer comprising germanium;

said dielectric layer;

said refractory metal silicide layer; and said electrically conductive layer.

7. The method as defined in claim 5, wherein:

said layer comprising germanium is an antireflective layer; and said selectively removing further comprises photolithography and etching.

8. The method as defined in claim 5, wherein the layer comprising germanium is an alloy of germanium and silicon.

9. A method for forming a structure comprising:

providing a dielectric layer;

forming a layer comprising germanium upon said dielectric layer; and selectively removing said dielectric layer beneath said layer comprising germanium.

10. The method as defined in claim 9, further comprising removing said layer comprising germanium.

11. The method as defined in claim 9, wherein selectively removing said dielectric layer beneath said layer comprising germanium comprises:

forming a pattern over said layer comprising germanium; and removing said dielectric layer and said layer comprising germanium through the pattern.

12. The method as defined in claim 11, further comprising:

removing the pattern; and removing said layer comprising germanium.

13. The method as defined in claim 9, wherein the layer comprising germanium is an alloy of germanium and silicon.

14. The method as defined in claim 9, wherein:

said dielectric layer is upon a refractory metal silicide layer which is upon an electrically conductive layer; and selectively removing said dielectric layer beneath said layer comprising germanium also selectively removes said refractory metal silicide layer and said electrically conductive layer.

15. The method as defined in claim 9, wherein selectively removing said dielectric layer beneath said layer comprising germanium comprises an anisotropic etch of said dielectric layer and said layer comprising germanium.

16. A patterning method comprising:

forming a plurality of stack layers upon a semiconductor substrate;

forming over said plurality of stack layers a layer composed of an alloy of germanium and silicon;

forming a pattern over the layer composed of an alloy of germanium and silicon;

etching said plurality of stack layers through the pattern;

removing the pattern; and removing the layer composed of an alloy of germanium and silicon.

17. The method as defined in claim 16, further comprising patterning said plurality of stack layers as active area stack layers.

18. The method as defined in claim 16, further comprising patterning said plurality of stack layers as gate stack layers.

19. The method as defined in claim 16, wherein:

said alloy of germanium and silicon is composed of $Si_xGe_y$;

the value of x is not greater than about 0.2; and the value of y is not greater than about 1.0.

20. A patterning method comprising:

forming a plurality of stack layers upon a semiconductor substrate;

forming over said plurality of stack layers a passivation layer composed of silicon nitride and having a thickness in the range of about 1200–2400 Angstroms;

forming a layer comprising an alloy of germanium and silicon upon said passivation layer, said layer comprising an alloy of germanium and silicon having a thickness in a range of about 200 Angstroms to 800 Angstroms;

forming a pattern over said layer comprising an alloy of germanium and silicon; and removing said layer comprising an alloy of germanium and silicon through the pattern.

21. The method as defined in claim 20, further comprising patterning said plurality of stack layers as active area stack layers.

22. The method as defined in claim 20, further comprising patterning said plurality of stack layers as gate stack layers.

23. The method as defined in claim 20, wherein:

said alloy of germanium and silicon is composed of $Si_xGe_y$;

the value of x is not greater than about 0.2; and the value of y is not greater than about 1.0.

24. A patterning method comprising:

depositing a plurality of stack layers upon a layer of silicon, the uppermost layer of said plurality of stack layers being a silicon nitride layer;

depositing over said silicon nitride layer a layer comprising an alloy of germanium and silicon, said silicon nitride layer having a thickness in the range of about 200–2400 Angstroms, said layer comprising an alloy of germanium and silicon having a thickness in a range of about 200 Angstroms to about 800 Angstroms;

forming a pattern upon said layer comprising an alloy of germanium and silicon; and removing said layer comprising an alloy of germanium and silicon.

25. The method as defined in claim 24, further comprising patterning said plurality of stack layers as active area stack layers.

26. The method as defined in claim 24, further comprising patterning said plurality of stack layers as gate stack layers.

27. The method as defined in claim 24, wherein:

said alloy of germanium and silicon is composed of $Si_xGe_y$;

the value of x is not greater than about 0.2; and the value of y is not greater than about 1.0.

28. A method for forming a structure comprising:

providing an electrically conductive layer;

forming a refractory metal suicide layer upon said electrically conductive layer;

forming a silicon nitride layer upon said refractory metal silicide layer, said silicon nitride layer having a thickness in the range of about 200–2400 Angstroms;

forming a layer composed of an alloy of germanium and silicon upon said silicon nitride layer;

forming a pattern over the layer composed of an alloy of germanium and silicon;

removing said silicon nitride layer, said layer composed of an alloy of germanium and silicon, said refractory metal silicide layer, and said electrically conductive layer through the pattern;

removing the pattern; and removing said layer composed of an alloy of germanium and silicon.

29. The method as defined in claim 28, wherein:

said alloy of germanium and silicon is composed of $Si_xGe_y$;

the value of x is not greater than about 0.2; and the value of y is not greater than about 1.0.

* * * * *

UNITED STATES PATENT AND TRADEMARK OFFICE
CERTIFICATE OF CORRECTION

PATENT NO. : 6,417,113 B1
DATED : July 9, 2002
INVENTOR(S) : Werner Juengling

It is certified that error appears in the above-identified patent and that said Letters Patent is hereby corrected as shown below:

Column 8,
Line 4, change "suicide" to -- silicide --

Signed and Sealed this

Thirty-first Day of December, 2002

JAMES E. ROGAN
*Director of the United States Patent and Trademark Office*